United States Patent
Sumitomo et al.

(10) Patent No.: US 8,659,065 B2
(45) Date of Patent: Feb. 25, 2014

(54) SEMICONDUCTOR DEVICE AND METHOD OF MANUFACTURING THE SAME

(75) Inventors: Masakiyo Sumitomo, Okazaki (JP); Yasushi Higuchi, Okazaki (JP); Shigemitsu Fukatsu, Okazaki (JP)

(73) Assignee: DENSO CORPORATION, Kariya (JP)

( * ) Notice: Subject to any disclaimer, the term of this patent is extended or adjusted under 35 U.S.C. 154(b) by 93 days.

(21) Appl. No.: 13/225,648

(22) Filed: Sep. 6, 2011

(65) Prior Publication Data

US 2012/0056241 A1 Mar. 8, 2012

(30) Foreign Application Priority Data

Sep. 8, 2010 (JP) ................................. 2010-200764
Jun. 30, 2011 (JP) ................................. 2011-145461

(51) Int. Cl.
*H01L 27/108* (2006.01)

(52) U.S. Cl.
USPC ............................ 257/302; 257/139; 438/270

(58) Field of Classification Search
USPC .................... 257/139, 302; 438/270
See application file for complete search history.

(56) References Cited

U.S. PATENT DOCUMENTS

| | | | |
|---|---|---|---|
| 6,541,818 B2 | 4/2003 | Pfirsch et al. | |
| 6,551,881 B1 | 4/2003 | Letavic | |
| 7,183,610 B2 * | 2/2007 | Pattanayak et al. | ........... 257/333 |
| 7,701,003 B2 | 4/2010 | Minato et al. | |
| 7,910,962 B2 * | 3/2011 | Lu | ................. 257/260 |
| 7,955,930 B2 | 6/2011 | Minato et al. | |
| 2002/0006703 A1 | 1/2002 | Pfirsch et al. | |
| 2005/0242392 A1 | 11/2005 | Pattanayak et al. | |
| 2006/0267085 A1 * | 11/2006 | Matsuura | ...................... 257/330 |
| 2007/0001263 A1 | 1/2007 | Nakagawa | |
| 2007/0187753 A1 | 8/2007 | Pattanayak et al. | |
| 2007/0290260 A1 | 12/2007 | Adan | |
| 2008/0054351 A1 | 3/2008 | Ooki | |
| 2008/0182376 A1 | 7/2008 | Pattanayak et al. | |
| 2010/0019316 A1 | 1/2010 | Pattanayak et al. | |
| 2011/0136309 A1 * | 6/2011 | Grivna et al. | ................. 438/270 |

FOREIGN PATENT DOCUMENTS

| | | |
|---|---|---|
| JP | A-08-11605 | 5/1996 |
| JP | A-H09-283535 | 10/1997 |
| JP | A-H11-031815 | 2/1999 |

(Continued)

OTHER PUBLICATIONS

Office Action mailed Aug. 7, 2012 in a corresponding Japanese application No. 2011-145461.

(Continued)

*Primary Examiner* — David Vu
*Assistant Examiner* — Brandon Fox
(74) *Attorney, Agent, or Firm* — Posz Law Group, PLC

(57) ABSTRACT

A semiconductor device includes a drift layer, a base layer on the drift layer, and trench gate structures. Each trench gate structure includes a trench reaching the drift layer by penetrating the base layer, a gate insulation layer on a wall surface of the trench, and a gate electrode on the gate insulation layer. A bottom portion of the trench gate structure is located in the drift layer and expands in a predetermined direction so that a distance between the bottom portions of adjacent trench gate structures is less than a distance between opening portions of adjacent trench gate structures in the direction. A thickness of the gate insulation layer is greater in the bottom portion than in the opening portion.

15 Claims, 10 Drawing Sheets

(56) References Cited

FOREIGN PATENT DOCUMENTS

| | | |
|---|---|---|
| JP | A-2001-230414 | 8/2001 |
| JP | A-2002-533936 | 10/2002 |
| JP | A-2008-153389 | 7/2008 |
| JP | A-2009-4996 | 1/2009 |
| JP | A-2010-251608 | 11/2010 |

OTHER PUBLICATIONS

Office Action mailed Dec. 11, 2012 in corresponding JP Application No. 2011-145461 (and English translation).

Office Action dated Nov. 5, 2013 in the corresponding CN application No. 201110266729.X (English translation).

\* cited by examiner

SEMICONDUCTOR DEVICE AND METHOD OF MANUFACTURING THE SAME

CROSS REFERENCE TO RELATED APPLICATION

This application is based on and claims priority to Japanese Patent Application No. 2010-200764 filed on Sep. 8, 2010 and No. 2011-145461 filed on Jun. 30, 2011, the contents of which are incorporated herein by reference.

TECHNICAL FIELD

The present invention relates to a semiconductor device having an insulated gate bipolar transistor (IGBT) and also relates to a method of manufacturing the semiconductor device.

BACKGROUND

A semiconductor device having an IGBT has been known as a power converter used in an electronic apparatus such as an industrial motor. A typical structure of such a semiconductor device is as follow.

An $N^-$-type drift layer is formed on a $P^+$-type semiconductor substrate as a collector layer. A P-type base layer is formed in a surface portion of the $N^-$-type drift layer. An $N^+$-type emitter layer is formed in a surface portion of the P-type base layer. Trenches penetrating the P-type base layer and the $N^+$-type emitter layer and reaching the $N^-$-type drift layer are arranged in a stripe pattern. A gate insulation layer and a gate electrode are formed on a wall of each trench so that a trench gate structure can be formed. An emitter electrode is formed on the P-type base layer and the $N^+$-type emitter layer through an interlayer dielectric layer. The emitter electrode is electrically connected to the P-type base layer and the $N^+$-type emitter layer through a contact hole formed in the interlayer dielectric layer. A collector electrode is formed on a back surface of the collector layer and electrically connected to the collector layer.

In such a semiconductor device, when a predetermined gate voltage is applied to a gate electrode, an inversion layer is formed in a portion of the P-type base layer in contact with the gate insulation layer, and an electron accumulation layer is formed in a portion of the $N^-$-type drift layer in contact with the gate insulation layer. Then, electrons flow from the $N^+$-type emitter layer to the $N^-$-type drift layer through the inversion layer and the accumulation layer, and holes flow from the collector layer to the $N^-$-type drift layer. Thus, a resistance decreases due to conductivity modulation so that the semiconductor device can be turned ON.

Although an ON-voltage of the semiconductor device having such an IGBT is smaller than that of a semiconductor device having a metal-oxide semiconductor field-effect transistor (MOSFET), there has been an increasing demand to further reduce the ON-voltage.

In the semiconductor device disclosed in US 2007/0001263 corresponding to JP-A-2007-43123, the distance between adjacent gate electrodes is set to a very small value ranging from 0.55 nm to 0.3 µm.

In the semiconductor device disclosed in JP-A-2008-153389, the width of the bottom of the trench gate structure is greater than the width of the other portion of the trench gate structure so that the distance between the bottoms of adjacent trench gate structures can be smaller than the distance between the other portions of the trench gate structures.

In such a semiconductor device as disclosed in US 2007/0001263 or JP-A-2008-153389, it is less likely that holes flowing into the $N^-$-type drift layer flow to the P-type base layer through a space between adjacent trench gate structures. Thus, a lot of holes can be accumulated in the $N^-$-type drift layer. Thus, the amount of electrons injected from the emitter layer into the $N^-$-type drift layer through the inversion layer and the accumulation layer is increased. Since the electron mobility is greater than the hole mobility, the ON-voltage can be further reduced.

By the way, there has been an increasing demand to improve a load short-circuit capability of a semiconductor device while reducing an ON-voltage of the semiconductor device.

That is, when a load is short-circuited, a large saturation current flows so that Joule heat proportional to the saturation current can be generated. As a result, a temperature of the semiconductor device may be increased above the maximum allowable temperature.

SUMMARY

In view of the above, it is an object of the present invention to provide a semiconductor device having a low ON-voltage and an improved load short-circuit capability. It is another object of the present invention to provide a method of manufacturing the semiconductor device.

According to a first aspect of the present invention, a semiconductor device includes a first conductivity-type drift layer, a second conductivity-type base layer on a front side of the drift layer, trench gate structures, a first conductivity-type emitter layer located in a surface portion of the base layer and located adjacent to the trench gate structure, and a second conductivity-type collector layer located across the drift layer from the emitter layer. Each trench gate structure includes a trench reaching the drift layer by penetrating the base layer, a gate insulation layer on a wall surface of the trench, and a gate electrode on the gate insulation layer. The trench gate structure has a length direction parallel to a planar direction of the drift layer, a width direction parallel to the planar direction of the drift layer and perpendicular to the length direction, and a depth direction perpendicular to the planar direction of the drift layer. The trench gate structure has a bottom portion and an opening portion. The bottom portion defines a bottom of the trench gate structure. The opening portion is located on an opposite side of the trench gate structure from the bottom portion in the depth direction. The bottom portion is located in the drift layer and expands in the width direction so that a distance between the bottom portions of adjacent trench gate structures is less than a distance between the opening portions of adjacent trench gate structures in the width direction. A thickness of the gate insulation layer on the wall surface of the trench of the bottom portion is greater than a thickness of the gate insulation layer on the wall surface of the trench of the opening portion.

According to a second aspect of the present invention, a first method of manufacturing the semiconductor device includes preparing a substrate including the collector layer, the drift layer, on the collector layer, and the base layer on the drift layer. The first method further includes forming a first trench in the base layer by an anisotropic etching process, forming a first gate insulation layer in the first trench, forming an oxygen impermeable protection layer on the first gate insulation layer in the first trench, forming a second trench communicating with the first trench by removing the protection layer on a bottom of the first trench by an anisotropic etching process in such a manner that the second trench has a bottom in the drift layer, forming a second gate insulation layer thicker than the first gate insulation layer in the second trench by a thermal oxidation process in such a manner that the bottom portion of the trench gate structure is located in the drift layer and expands in the width direction.

According to a third aspect of the present invention, a second method of manufacturing the semiconductor device includes preparing a substrate including the collector layer, the drift layer, on the collector layer, and the base layer on the drift layer. The second method further includes forming a first trench in the base layer by an anisotropic etching process, forming a first insulation layer in the first trench, forming a second trench communicating with the first trench by removing the first insulation layer on a bottom of the first trench by an anisotropic etching process in such a manner that the second trench has a bottom in the drift layer, forming a second gate insulation layer in the second trench by a thermal oxidation process in such a manner that the bottom portion of the trench gate structure is located in the drift layer and expands in the width direction, filling the first trench and the second trench with a first conductive material to form the gate electrode, removing the first conductive material in the first trench, removing the first insulation layer on a side wall of the first trench, forming a second insulation layer on the first conductive material in the second trench in such a manner that the first gate insulation layer thinner than the second gate insulation layer is formed on a side wall of the first trench, and filling the first trench with a second conductive material to form the gate electrode.

According to a fourth aspect of the present invention, a third method of manufacturing the semiconductor device includes preparing a substrate including the drift layer and the base layer on a front side of the drift layer. The third method further includes forming a first trench in the base layer by an anisotropic etching process, forming a first gate insulation layer in the first trench, forming an oxygen impermeable protection layer on the first gate insulation layer in the first trench, forming a second trench communicating with the first trench by removing the protection layer on a bottom of the first trench by an anisotropic etching process in such a manner that the second trench has a bottom in the drift layer, forming a second gate insulation layer thicker than the first gate insulation layer in the second trench by a thermal oxidation process in such a manner that the bottom portion of the trench gate structure is located in the drift layer and expands in the width direction, and forming the collector layer by ion implantation of impurities into the substrate and by annealing the substrate.

According to a fifth aspect of the present invention, a fourth method of manufacturing the semiconductor device includes preparing a substrate including the drift layer and the base layer on a front side of the drift layer. The fourth method further includes forming a first trench in the base layer by an anisotropic etching process, forming a first insulation layer in the first trench, forming a second trench communicating with the first trench by removing the first insulation layer on a bottom of the first trench by an anisotropic etching process in such a manner that the second trench has a bottom in the drift layer, forming a second gate insulation layer in the second trench by a thermal oxidation process in such a manner that the bottom portion of the trench gate structure is located in the drift layer and expands in the width direction, filling the first trench and the second trench with a first conductive material to form the gate electrode, removing the first conductive material in the first trench, removing the first insulation layer on a side wall of the first trench, forming a second insulation layer on the first conductive material in the second trench in such a manner that the first gate insulation layer thinner than the second gate insulation layer is formed on a side wall of the first trench, filling the first trench with a second conductive material to form the gate electrode, and forming the collector layer by ion implantation of impurities into the substrate and by annealing the substrate.

BRIEF DESCRIPTION OF THE DRAWINGS

The above and other objects, features, and advantages will become more apparent from the following description and drawings in which like reference numerals depict like elements. In the drawings.

DETAILED DESCRIPTION OF THE PREFERRED EMBODIMENTS

First Embodiment

Figure 1:
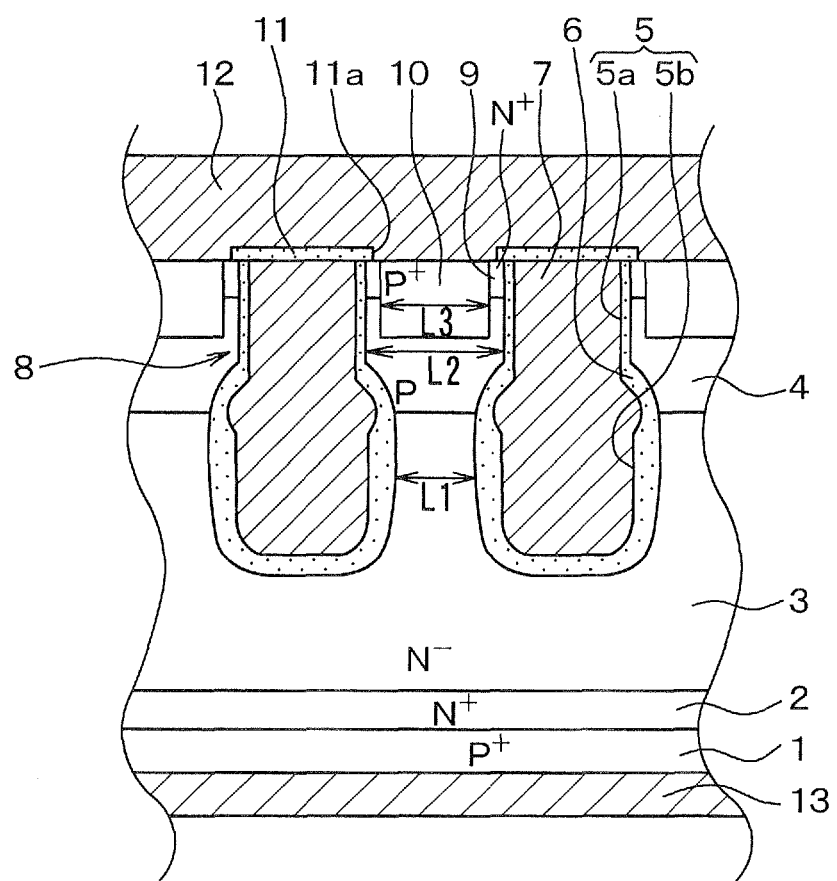
FIG. 1 is a diagram illustrating a cross-sectional view of a semiconductor device according to a first embodiment of the present invention.

A semiconductor device according to a first embodiment of the present invention is described below with reference to FIG. 1. FIG. 1 is a diagram illustrating a cross-sectional view of the semiconductor device.

As shown in FIG. 1, an $N^+$-type buffer layer 2 is formed on a main surface of a semiconductor substrate that provides a $P^+$-type collector layer 1. An $N^-$-type drift layer 3 is formed on the $N^+$-type buffer layer 2. A P-type base layer 4 is formed in a surface portion of the $N^-$-type drift layer 3.

Trenches 5 penetrate the P-type base layer 4 and reach the $N^-$-type drift layer 3. The trenches 5 extend in a first direction parallel to the main surface of the semiconductor substrate and are arranged in a stripe pattern. According to the first embodiment, the first direction is perpendicular to a surface of the drawing sheet containing FIG. 1. A gate insulation layer 6 is formed on a wall surface of each trench 5. A gate electrode 7 is formed on the gate insulation layer 6 so that the trench 5 can be filled with the gate insulation layer 6 and the gate electrode 7. Thus, the trench 5, the gate insulation layer 6, and the gate electrode 7 construct a trench gate structure 8.

A bottom portion of each trench gate structure 8 is located at least in the N$^-$-type drift layer 3 and expands in a second direction parallel to the main surface of the semiconductor substrate (i.e., parallel to a planar direction of the N$^-$-type drift layer 3). The second direction is perpendicular to the first direction. Thus, as shown in FIG. 1, a first distance L1 between the bottom portions of adjacent trench gate structures 8 is less than a second distance L2 between opening portions of adjacent trench gate structures 8 in the second direction. For example, the first distance L1 can be about 0.5 micrometers (μm), and the second distance L2 can be about 1.5 μm.

In other words, the second distance L2 indicates a width of a surface portion of the P-type base layer 4 between adjacent trench gate structures 8. According to the first embodiment, as shown in FIG. 1, the bottom portion of the trench gate structure 8 is located over an interface between the N$^-$-type drift layer 3 and the P-type base layer 4. That is, the bottom portion of the trench gate structure 8 is located both in the N$^-$-type drift layer 3 and the P-type base layer 4.

It is noted that a threshold voltage Vt of a MOS region constructed with the P-type base layer 4, the gate insulation layer 6, the gate electrode 7, and an N$^+$-type emitter layer 9 depends on a maximum value of an impurity concentration of the P-type base layer 4. The bottom portion of the trench gate structure 8 extends to the N$^-$-type drift layer 3 from a first portion of the P-type base layer 4 over the interface between the N$^-$-type drift layer 3 and the P-type base layer 4. The first portion of the P-type base layer 4 is located closer to the N$^-$-type drift layer 3 than a second portion of the P-type base layer 4. The P-type base layer 4 has the maximum value of the impurity concentration at the second portion. That is, the bottom portion of the trench gate structure 8 extends to the N$^-$-type drift layer 3 from the first portion of the P-type base layer 4, which does not affect the threshold voltage Vt of the MOS region. Alternatively, the bottom portion of the trench gate structure 8 can be located only in the N$^-$-type drift layer 3.

According to the first embodiment, the trench 5 of the trench gate structure 8 includes a first trench 5a and a second trench 5b. The first trench 5a is located in the P-type base layer 4 and extends in a direction perpendicular to the main surface of the semiconductor substrate. The second trench 5b communicates with the first trench 5a and extends from near the interface between the N$^-$-type drift layer 3 and the P-type base layer 4 to the N$^-$-type drift layer 3. A distance between opposing points on a side wall of the second trench 5b is greater than a distance between opposing points on a side wall of the first trench 5a. In other words, a width of an opening of the second trench 5b is greater than a width of an opening of the first trench 5a so that the trench 5 can have a vase shape. The first trench 5a, the gate insulation layer 6 formed on a wall surface of the first trench 5a, and the gate electrode 7 filling the first trench 5a define the opening portion of the trench gate structure 8. The second trench 5b, the gate insulation layer 6 formed on a wall surface of the second trench 5b, and the gate electrode 7 filling the second trench 5b define the bottom portion of the trench gate structure 8. The trench 5 has a joint portion that connects the first trench 5a and the second trench 5b. The joint portion of the trench 5 is shaped (i.e., rounded) to have a first curvature. A corner of a bottom surface of the second trench 5b is shaped (i.e., rounded) to have a second curvature.

A thickness of the gate insulation layer 6 on the wall surface of the trench 5 defining the bottom portion of the trench gate structure 8 is greater than a thickness of the gate insulation layer 6 on the wall surface of the trench 5 defining the opening portion of the trench gate structure 8. Specifically, the thickness of the gate insulation layer 6 on the wall surface of the second trench 5b is greater than the thickness of the gate insulation layer 6 on the wall surface of the first trench 5a. More specifically, the thickness of the gate insulation layer 6 on the side wall of the second trench 5b is greater than the thickness of the gate insulation layer 6 on the side wall of the first trench 5a. For example, the thickness of the gate insulation layer 6 on the side wall of the second trench 5b can range from about 200 nanometers (nm) to about 300 nm, and the thickness of the gate insulation layer 6 on the side wall of the first trench 5a can be about 100 nm.

Further, the thickness of the gate insulation layer 6 on the side wall of the joint portion, which connects the first trench 5a and the second trench 5b, is almost equal to the thickness of the gate insulation layer 6 on the side wall of the second trench 5b and greater than the thickness of the gate insulation layer 6 on the side wall of the first trench 5a.

The N$^+$-type emitter layer 9 is formed in the surface portion of the P-type base layer 4 and located adjacent to the trench gate structure 8. Further, a P$^+$-type contact layer 10 having an impurity concentration greater than an impurity concentration of the P-type base layer 4 is formed in the surface portion of the P-type base layer 4. The P$^+$-type contact layer 10 is located adjacent to and across the N$^+$-type emitter layer 9 from the trench gate structure 8. Thus, the P$^+$-type contact layer 10 is located between adjacent trench gate structures 8 and located directly above the N$^-$-type drift layer 3 between the bottom portions of adjacent trench gate structures 8.

According to the first embodiment, a depth of the P$^+$-type contact layer 10 is greater than a depth of the N$^+$-type emitter layer 9 from a surface of the P-type base layer 4. Further, a width L3 of the P$^+$-type contact layer 10 in the second direction is greater than the first distance L1 between the bottom portions of adjacent trench gate structures 8. As mentioned previously, the second direction is parallel to the main surface of the semiconductor substrate (i.e., P$^+$-type collector layer 1) and perpendicular to the first direction in which the trench 5 extends. For example, the width L3 of the P$^+$-type contact layer 10 can be about 0.8 μm.

An emitter electrode 12 is formed through an interlayer dielectric layer 11 on the N$^+$-type emitter layer 9, the P$^+$-type contact layer 10, and the gate electrode 7. The emitter electrode 12 is electrically connected to the N$^+$-type emitter layer 9 and the P$^+$-type contact layer 10 through a contact hole 11a formed in the interlayer dielectric layer 11. A collector electrode 13 is formed on a back surface of the P$^+$-type collector layer 1 and electrically connected to the P$^+$-type collector layer 1. Up to this point, the structure of the semiconductor device according to the first embodiment is described. In the first embodiments, N$^+$-type and N$^-$-type are defined as a first conductivity-type, and P$^+$-type and P$^-$-type are defined as a second conductivity-type.

Next, a method of manufacturing the semiconductor device according to the first embodiment is described below with reference to FIGS. 2A-2D and 3A-3D. For ease of explanation, the distance between adjacent trench gate structures 8 is larger in FIGS. 2A-2D and 3A-3D than in FIG. 1.

Figure 2A:
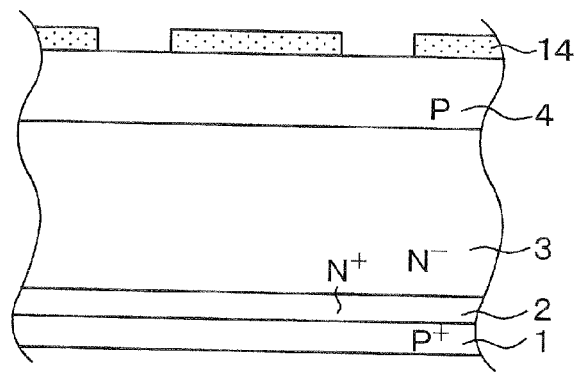
FIGS. 2A-2D are diagrams illustrating processes of manufacturing the semiconductor device of FIG. 1.

Firstly, as shown in FIG. 2A, a substrate, in which the N$^+$-type buffer layer 2, the N$^-$-type drift layer 3, and the P-type base layer 4 are formed in this order on the semiconductor substrate as the P$^+$-type collector layer 1, is prepared. Then, an etching mask 14 made of silicon oxide or the like is formed on the P-type base layer 4 by a chemical vapor deposition (CVD) process or the like. Then, an opening is formed by patterning the etching mask 14 at a position where the first trench 5a is to be formed.

Figure 2B:
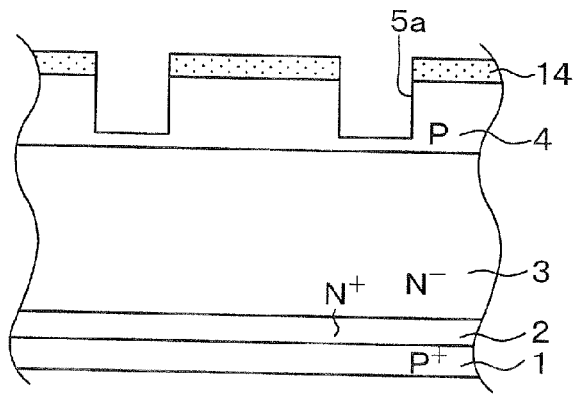

Next, as shown in FIG. 2B, an anisotropic etching process such as a reactive ion etching (RIE) process is performed by using the etching mask 14 to form the first trench 5a. According to the first embodiment, the first trench 5a is terminated in the P-type base layer 4. Specifically, both a first end defining an opening of the first trench 5a and a second end opposite to the first end of the first trench 5a are located in the P-type base layer 4. Therefore, the anisotropic etching process is performed so that the first trench 5a can extend from a surface of the P-type base layer 4 to near the interface between the N⁻-type drift layer 3 and the P-type base layer 4. Then, as necessary, a chemical dry etching (CDE) or the like can be performed to remove damage in the wall surface of the first trench 5a.

Figure 2C:
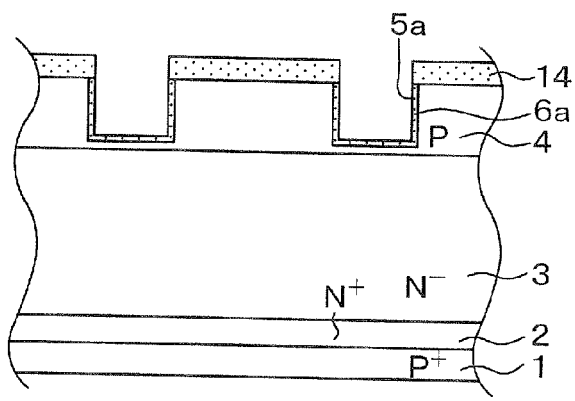

Then, as shown in FIG. 2C, a first gate insulation layer 6a for the gate insulation layer 6 is formed on the wall surface of the first trench 5a by a thermal oxidation process. Alternatively, the first gate insulation layer 6a can be formed by another process such as a CVD process.

Figure 2D:
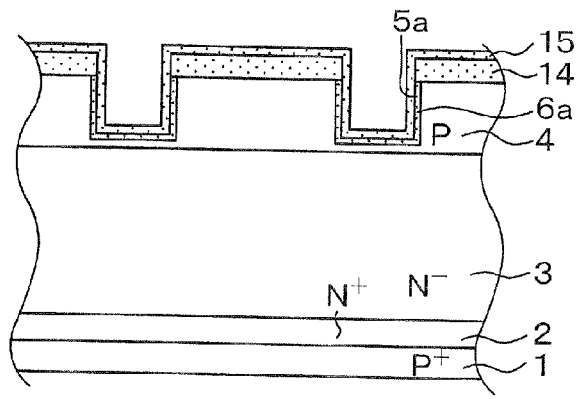

Next, as shown in FIG. 2D, an oxygen impermeable protection layer 15 is formed. The protection layer 15 protects the wall surface of the first trench 5a from being thermally oxidized in a process shown in FIG. 3A, which is described later. According to the first embodiment, the protection layer 15 is a silicon nitride (SiN) layer and formed by a CVD process in such a manner that the wall surface of the first trench 5a can be covered with the protection layer 15. Thus, as of the time when a process shown in FIG. 2D is finished, the first gate insulation layer 6a and the protection layer 15 are stacked in this order on the wall surface of the first trench 5a.

Figure 3A:
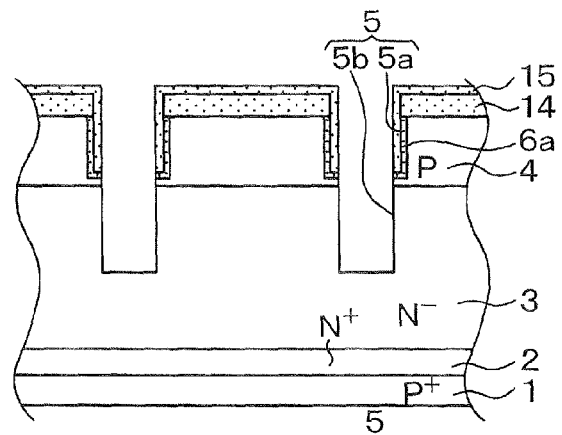
FIGS. 3A-3D are diagrams illustrating processes following the processes of FIGS. 2A-2D.

Then, as shown in FIG. 3A, an anisotropic etching process such as a RIE process is performed to selectively remove the protection layer 15 and the first gate insulation layer 6a on a bottom wall of the first trench 5a without removing the protection layer 15 on a side wall of the first trench 5a. Then, an anisotropic etching process such as a RIE process is applied to the bottom wall of the first trench 5a by using the remaining protection layer 15 as a mask in order to form the second trench 5b communicating with the first trench 5a and reaching the N⁻-type drift layer 3. As described above, in a process shown in FIG. 3A, the protection layer 15 remaining on the side wall of the first trench 5a is used as a mask for an anisotropic etching process to form the second trench 5b. Therefore, as of the time when the process shown in FIG. 3A is finished, the distance between opposing points on the side wall of the second trench 5b is less than the distance between opposing points on the side wall of the first trench 5a. In short, the width of the second trench 5b is less than the width of the first trench 5a.

Figure 3B:
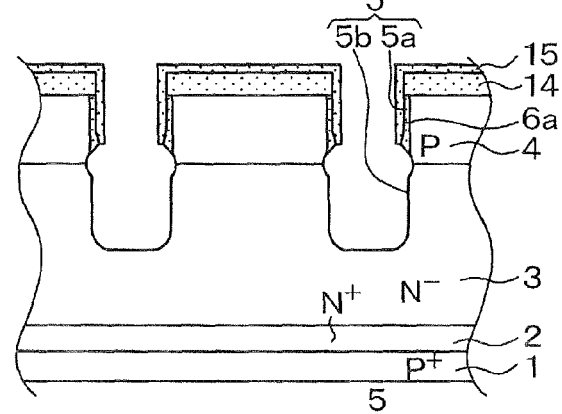

Next, as shown in FIG. 3B, isotropic etching of the second trench 5b is performed by using the protection layer 15 as an etching mask so that the distance between the opposing points on the side wall of the second trench 5b can be greater than the distance between the opposing points on the side wall of the first trench 5a. Thus, the trench 5 can be shaped like a vase. Since the second trench 5b is etched by an isotropic etching process, the joint portion between the first trench 5a and the second trench 5b is shaped to have the first curvature, and the corner of the bottom surface of the second trench 5b is shaped to have the second curvature.

Figure 3C:
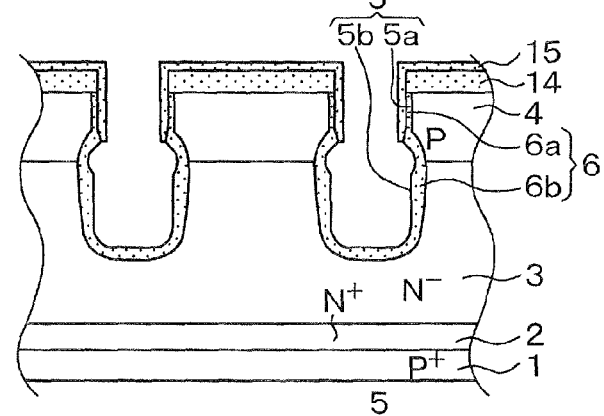

Then, as shown in FIG. 3C, a second gate insulation layer 6b for the gate insulation layer 6 is formed on the wall surface of the second trench 5b by a thermal oxidation process in such a manner that the thickness of the second gate insulation layer 6b can be greater than the thickness of the first gate insulation layer 6a on the wall surface of the first trench 5a. Since the side wall of the first trench 5a is covered with the oxygen impermeable protection layer 15, a thermal oxidation layer is not formed on the wall surface of the first trench 5a. Therefore, for example, the second gate insulation layer 6b thicker than the first gate insulation layer 6a can be formed by a wet oxidation process for a predetermined oxidation time at a temperature of 1150° C. Alternatively, the second gate insulation layer 6b can be formed by a dry oxidation process.

Figure 3D:
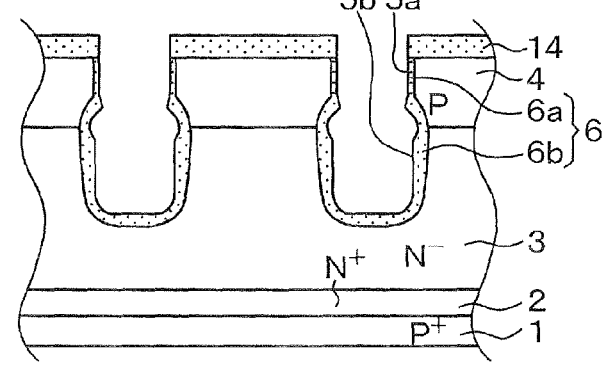

Then, as shown in FIG. 3D, the protection layer 15 is removed. Then, conventional semiconductor manufacturing processes are performed, for example, to form the gate electrode 7 by filling the trench 5 with conductive material such as doped polysilicon and to form the N⁺-type emitter layer 9, the P⁺-type contact layer 10, the interlayer dielectric layer 11, the emitter electrode 12, and the collector electrode 13. For example, when the N⁺-type emitter layer 9 and the P⁺-type contact layer 10 are formed by an ion implantation process, an ion acceleration voltage at which impurities for the P⁺-type contact layer 10 are implanted can be set greater than an ion acceleration voltage at which impurities for the N⁺-type emitter layer 9 are implanted. In such an approach, the depth of the P⁺-type contact layer 10 can be greater than the depth of the N⁺-type emitter layer 9. In this way, the semiconductor device according to the first embodiment is manufactured.

Next, operations of the semiconductor device according to the first embodiment are described below. Firstly, a turn-ON operation of the semiconductor device is described.

When a predetermined gate voltage is applied to the gate electrode 7, an n-type inversion layer is formed in a portion of the P-type base layer 4 in contact with the gate insulation layer 6 in the trench 5, and an electron accumulation layer is formed in a portion of the N⁻-type drift layer 3 in contact with the gate insulation layer 6 in the trench 5.

Then, electrons flow from the N⁺-type emitter layer 9 to the N⁻-type drift layer 3 through the inversion layer and the accumulation layer, and holes flow from the P⁺-type collector layer 1 to the N⁻-type drift layer 3. Thus, a resistance of the N⁻-type drift layer 3 decreases due to conductivity modulation so that the semiconductor device can be turned ON.

As described above, according to the first embodiment, the first distance L1 between the bottom portions of adjacent trench gate structures 8 is less than the second distance L2 between the opening portions of adjacent trench gate structures 8. Therefore, compared to when a distance between adjacent trench gate structures is equal to a width of a surface portion of a P-type base layer between adjacent trench gate structures, movement of holes injected into the N⁻-type drift layer 3 is restricted so that a lot of holes can be accumulated in the N⁻-type drift layer 3. Thus, the amount of electrons injected from the N⁺-type emitter layer 9 into the N⁻-type drift layer 3 through the inversion layer and the accumulation layer is increased so that an ON-voltage of the semiconductor device can be reduced.

Further, according to the first embodiment, the thickness of the gate insulation layer 6 formed in the second trench 5b is greater than the thickness of the gate insulation layer 6 formed in the first trench 5a. Specifically, the thickness of the gate insulation layer 6 on the side wall of the second trench 5b is greater than the thickness of the gate insulation layer 6 on the side wall of the first trench 5a. Therefore, compared to when the thickness of the gate insulation layer is uniform in the trench 5, a width of the accumulation layer is reduced so that saturation current can be reduced. Thus, a load short-circuit capability of the semiconductor device can be improved.

Figure 4A:
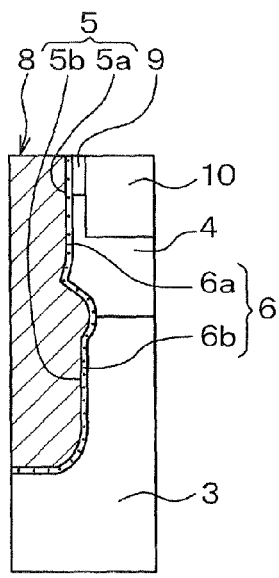
FIGS. 4A-4C are diagrams illustrating a cross-sectional view of a portion of a semiconductor device near a trench gate structure formed by changing an oxidation time for an insulation layer in a second trench of the trench gate structure.
Figure 4B:
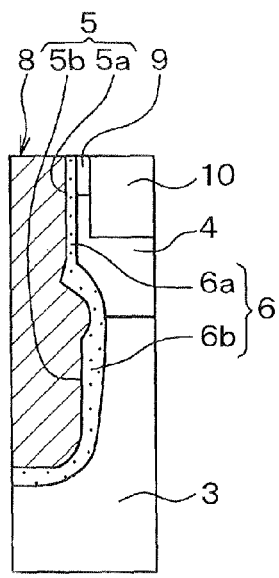
Figure 4C:
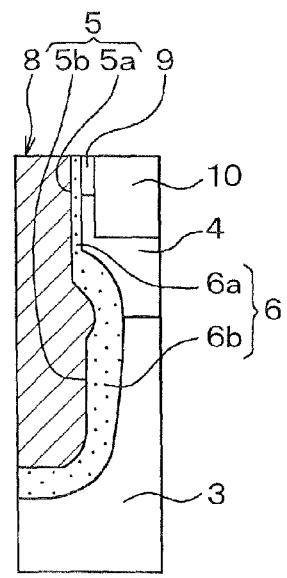

FIGS. 4A-4C are diagrams illustrating a cross-sectional view of a portion of the semiconductor device near the trench gate structure 8 observed by changing an oxidation time for which the oxidation process shown in FIG. 3C is performed to form the second gate insulation layer 6b on the wall surface of the second trench 5b.

The semiconductor device shown in FIG. 4A is formed as follows. The second trench 5b is formed without a process of forming the first gate insulation layer 6a shown in FIG. 2C, and then the gate insulation layer 6 is formed on the wall surface of the trench 5 in the process shown in FIG. 3C by performing a CVD process instead of a thermal oxidation process. Thus, in the semiconductor device shown in FIG. 4A, the thickness of the gate insulation layer 6 is uniform in the trench 5.

The semiconductor device shown in FIG. 4B is formed as follows. The second gate insulation layer 6b is formed in the process shown in FIG. 3C by performing a wet oxidation process for an oxidation time of 30 minutes at a temperature of 1150° C.

The semiconductor device shown in FIG. 4C is formed as follows. The second gate insulation layer 6b is formed in the process shown in FIG. 3C by performing a wet oxidation process for an oxidation time of 90 minutes at a temperature of 1150° C.

Figure 5A:
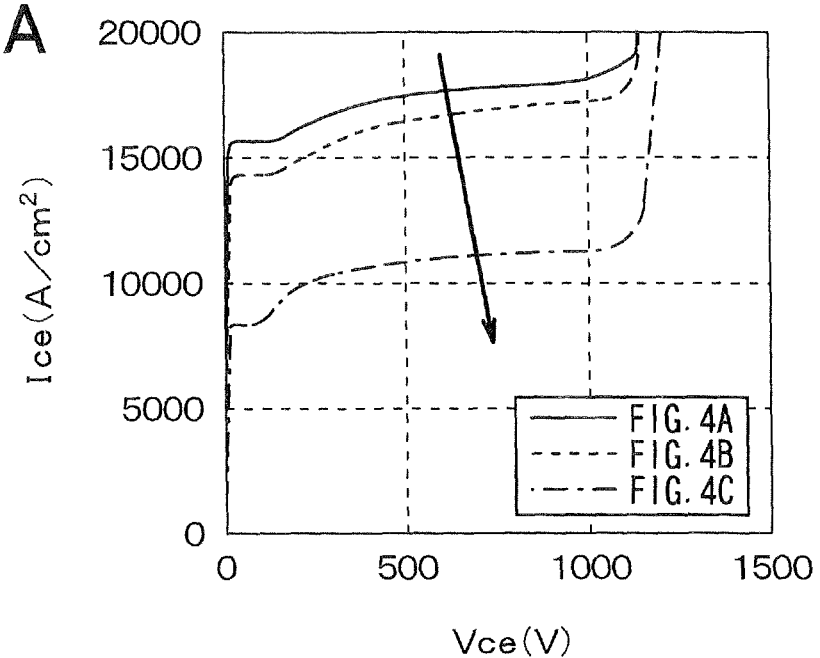
FIG. 5A illustrates a result of a simulation conducted to measure a relationship between a collector-emitter voltage and a collector-emitter current density in the semiconductor device shown in FIGS. 4A-4C when a load is short-circuited.
Figure 5B:
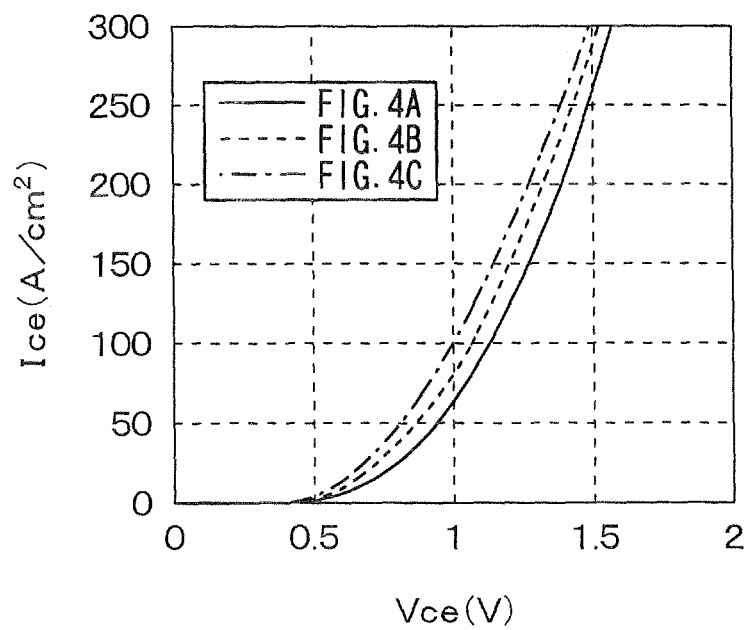
FIG. 5B illustrates a result of a simulation conducted to measure a relationship between a collector-emitter voltage and a collector-emitter current density in the semiconductor device shown in FIGS. 4A-4C when the load is not short-circuited.

FIGS. 5A and 5B illustrates a result of a simulation conducted to measure a relationship between a collector-emitter voltage Vice and a collector-emitter current Ice density in the semiconductor device shown in FIGS. 4A-4C. This simulation is performed under conditions that a gate-emitter voltage is 15 volts (V) and that an operating temperature is 27° C. It is noted that FIG. 5A illustrates the relationship observed when a load is short-circuited.

As can be seen from FIGS. 4A-4C, the thickness of the second gate insulation layer 6b increases with an increase in the oxidation time for which the wet oxidation process is performed to form the second trench 5b. Further, as can be seen from FIG. 5A, a saturation current decreases with an increase in the thickness of the second oxidation layer 6b. A reason for this is that as the second gate insulation layer 6b becomes thicker, the accumulation layer, which is formed in the portion of the N⁻-type drift layer 3 in contact with the gate insulation layer 6, becomes narrower so that a current path for the collector-emitter current can become narrower.

Further, as can be seen from FIG. 5B, as the second gate insulation layer 6b in the second trench 5b becomes thicker, the ON voltage becomes smaller. A reason for this is that as the second gate insulation layer 6b becomes thicker, the distance L1 between the bottom portions of adjacent trench gate structures 8 becomes smaller.

Thus, the semiconductor device according to the first embodiment can have both a low ON-voltage and an improved load short-circuit capability.

Next, a turn-OFF operation of the semiconductor device is described. When the gate voltage applied to the gate electrode 7 becomes zero, both the n-type inversion layer and the accumulation layer disappear. Then, the electron injection from the N⁺-type emitter layer 9 is stopped, and also the hole injection from the P⁺-type collector layer 1 is stopped. Thus, the holes accumulated in the N⁻-type drift layer 3 are ejected from the emitter electrode 12.

Referring back to FIG. 1, according to the first embodiment, the P⁺-type contact layer 10 is formed in the surface portion of the P-type base layer 4 and located directly above the N⁻-type drift layer 3 between the bottom portions of adjacent trench gate structures 8. Further, the depth of the P⁺-type contact layer 10 is greater than the depth of the N⁺-type emitter layer 9, and the width L3 of the P⁺-type contact layer 10 is greater than the first distance L1 between the bottom portions of adjacent trench gate structures 8. Therefore, compared to when the depth of the P⁺-type contact layer 10 is less than the depth of the N⁺-type emitter layer 9 or when the width of the P⁺-type contact layer 10 is less greater than the distance between adjacent trench gate structures 8, the holes are easily ejected from the emitter electrode 12 through the P⁺-type contact layer 10 so that a latch-up can be prevented.

Next, advantages of the first embodiment are described.

As described above, according to the first embodiment, the first distance L1 between the bottom portions of adjacent trench gate structures 8 is less than the second distance L2 between the opening portions of adjacent trench gate structures 8. Therefore, compared to when a distance between adjacent trench gate structures is equal to a width of a surface portion of a P-type base layer between adjacent trench gate structures, movement of holes injected into the N⁻-type drift layer 3 is restricted so that a lot of holes can be accumulated in the N⁻-type drift layer 3. Thus, the amount of electrons injected from the N⁺-type emitter layer 9 into the N⁻-type drift layer 3 through the inversion layer and the accumulation layer is increased. Since the electron mobility is greater than the hole mobility, the ON-voltage can be reduced.

Further, according to the first embodiment, the thickness of the gate insulation layer 6 in the second trench 5b is greater than the thickness of the gate insulation layer 6 in the first trench 5a. Specifically, the thickness of the gate insulation layer 6 on the side wall of the second trench 5b is greater than the thickness of the gate insulation layer 6 on the side wall of the first trench 5a. Therefore, compared to when the thickness of the gate insulation layer is uniform in the trench 5, the width of the accumulation layer is reduced so that the saturation current can be reduced. Thus, the load short-circuit capability of the semiconductor device can be improved.

It may be considered that a reduction in an ON voltage and an improvement in a load short-circuit capability may be achieved by increasing a thickness of a gate insulation layer, even when the gate insulation layer has a uniform thickness. However, in such a case, the gate insulation layer between a P-type base layer and a gate electrode becomes too thick. As a result, a threshold voltage Vt of a MOS region constructed with a N⁺-type emitter layer, a P⁺-type base layer, a gate insulation layer, and a gate electrode is increased. In contrast, according to the first embodiment, the load short-circuit capability can be improved without increasing the threshold voltage Vt of the MOS region.

Further, according to the first embodiment, the first distance L1 between the bottom portions of adjacent trench gate structures 8 is less than the second distance L2 between the opening portions of adjacent trench gate structures 8. In other words, the width of the surface portion of the P-type base layer 4 between adjacent trench gate structures 8 is greater than the distance between the bottom portions of adjacent trench gate structures 8.

Therefore, the semiconductor device according to the first embodiment can have the following advantages compared to a semiconductor device, such as disclosed in US 20070001263, where a distance between adjacent trench gate structures is constant and very small. Firstly, it is less likely that adjacent inversion layers, which are formed when the semiconductor device is turned ON, are joined together. Therefore, an increase in the saturation current can be prevented or reduced. Secondly, the total contact area of the N⁺-type emitter layer 9 and the P⁺-type contact layer 10, which are connected to the emitter electrode 12, is increased.

Accordingly, a contact resistance is reduced so that the ON-voltage can be further reduced. Thirdly, since the width of the surface portion of the P-type base layer 4 between adjacent trench gate structures 8 is large, alignment for connecting the emitter electrode 12 to the $N^+$-type emitter layer 9 and the $P^+$-type contact layer 10 can be easily performed. Thus, manufacturing process of the semiconductor device can be simplified.

Further, according to the first embodiment, the depth of the $P^+$-type contact layer 10 is greater than the depth of the $N^+$-type emitter layer 9, and the width L3 of the $P^+$-type contact layer 10 is greater than the first distance L1 between the bottom portions of adjacent trench gate structures 8. Therefore, compared to when the depth of the $P^+$-type contact layer 10 is less than the depth of the $N^+$-type emitter layer 9 or when the width of the $P^+$-type contact layer 10 is less greater than the distance between adjacent trench gate structures 8, the holes are easily ejected from the emitter electrode 12 through the $P^+$-type contact layer 10 when the semiconductor device is turned OFF. Thus, a latch-up can be prevented.

Further, according to the first embodiment, the second gate insulation layer 6b is formed in the second trench 5b by a thermal oxidation process. Therefore, the distance between the bottom portions of adjacent trench gate structures 8 can be adjusted by adjusting the thickness of the second gate insulation layer 6b. Thus, compared to when the second gate insulation layer 6b is formed by a CVD process or the like, it is less likely that a portion between adjacent trenches 5 is damaged or broken during the process.

Further, according to the first embodiment, the second gate insulation layer 6b thicker than the first gate insulation layer 6a is formed in the second trench 5b by a thermal oxidation process, after the first gate insulation layer 6a is formed in the first trench 5a. In such an approach, it is possible to cause the insulation layer formed on the joint portion between the first trench 5a and the second trench 5b to be thick. In contrast, if the gate insulation layer 6 is formed in the first trench 5a and the second trench 5b at the same time, it is difficult to cause the gate insulation layer 6 on the joint portion to be thick.

Second Embodiment

Figure 6:
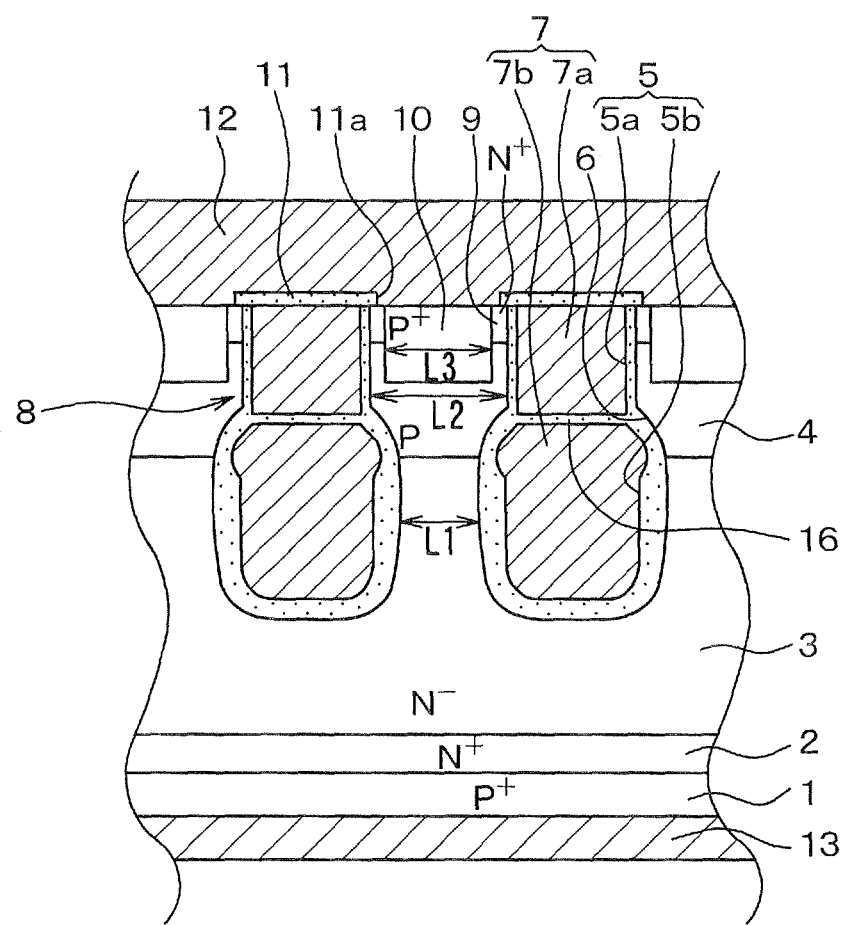
FIG. 6 is a diagram illustrating a cross-sectional view of a semiconductor device according to a second embodiment of the present invention.

A semiconductor device according to a second embodiment of the present invention is described below with reference to FIG. 6. FIG. 6 is a diagram illustrating a cross-sectional view of the semiconductor device. A difference between the first embodiment and the second embodiment is a structure of the gate electrode 7.

As shown in FIG. 6, according to the second embodiment, an insulation layer 16 is located near the joint portion between the first trench 5a and the second trench 5b and divides the gate electrode 7 in the depth direction to form a first portion 7a and a second portion 7b. The first portion 7a is located closer to the opening of the trench 5 than the second portion 7b. In other words, the second portion 7b is located closer to the bottom of the trench 5 than the first portion 7a. Although not shown in FIG. 6, the second portion 7b is elongated to the surface of the P-type base layer 4 and electrically connected to a gate wiring so that the first portion 7a and the second portion 7b can be at the same potential.

Next, a method of manufacturing the semiconductor device shown in FIG. 6 is described below with reference to FIGS. 7A-7D, 8A-8D, and 9A-9D.

Figure 7A:
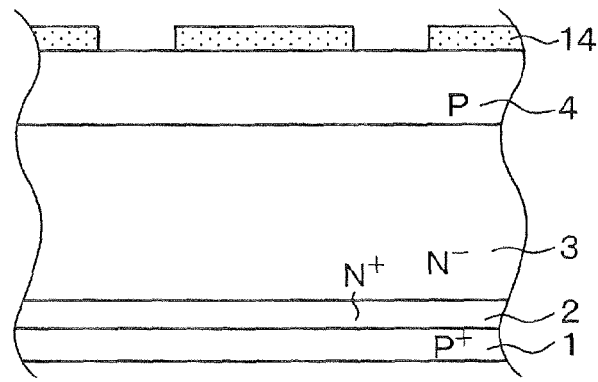
FIGS. 7A-7D are diagrams illustrating processes of manufacturing the semiconductor device of FIG. 6.
Figure 7B:
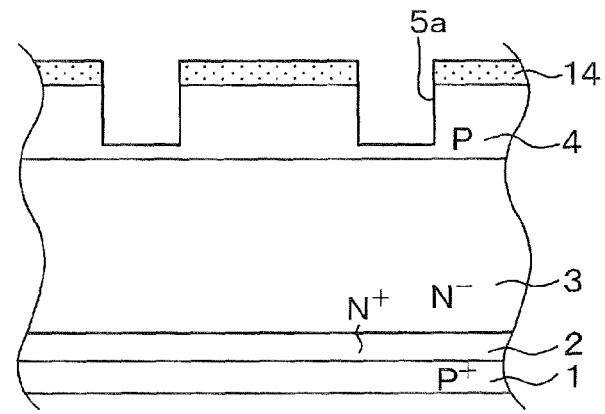

Firstly, in processes shown in FIGS. 7A and 7B, an anisotropic etching process such as a RIE process is performed to form the first trench 5a. It is noted that the processes shown in FIGS. 7A and 7B are the same as the processes shown in FIGS. 2A and 2B.

Figure 7C:
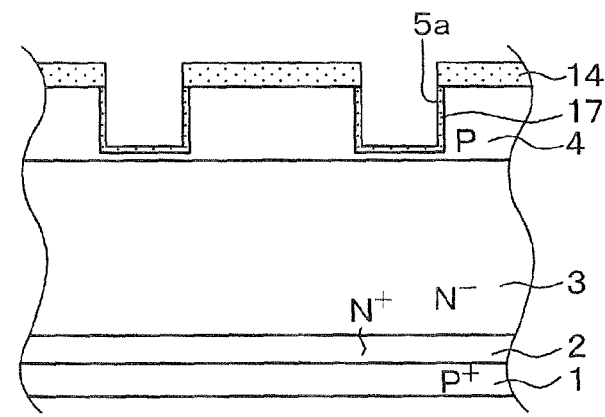

Next, in a process shown in FIG. 7C, an insulation layer 17 is formed on the wall surface of the first trench 5a by a thermal oxidation process. Alternatively, the insulation layer 17 can be formed by another process such as a CVD process.

Figure 7D:
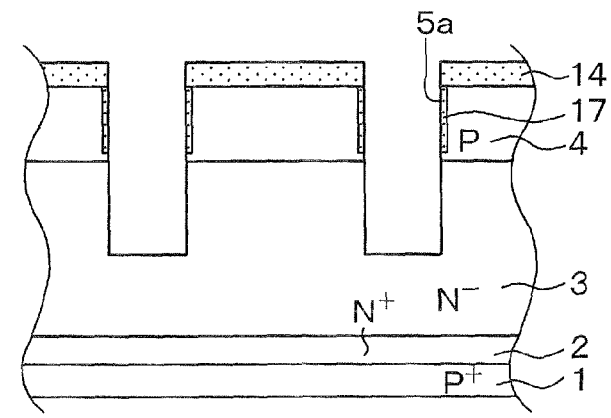

Then, as shown in FIG. 7D, an anisotropic etching process such as a RIE process is performed to selectively remove the insulation layer 17 on the bottom wall of the first trench 5a while keeping the insulation layer 17 on the side wall of the first trench 5a. Then, an anisotropic etching process such as a RIE process is applied to the bottom wall of the first trench 5a by using the remaining insulation layer 17 as an etching mask so that the second trench 5b communicating with the first trench 5a and reaching the $N^-$-type drift layer 3 can be formed. After the process shown in FIG. 7D is finished, the distance between opposing points on the side wall of the second trench 5b is almost equal to the distance between opposing points on the side wall of the first trench 5a. In short, the width of the second trench 5b is almost equal to the width of the first trench 5a.

Figure 8A:
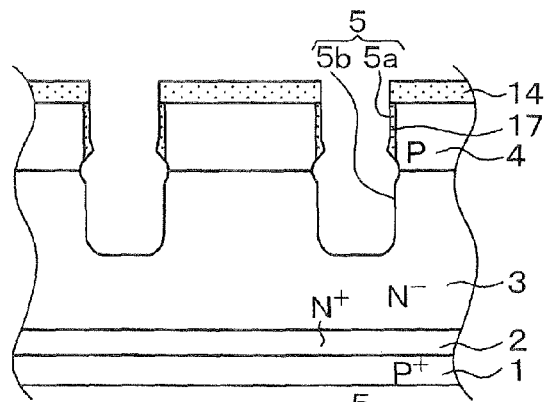
FIGS. 8A-8D are diagrams illustrating processes following the processes of FIGS. 7A-7D.
Figure 8B:
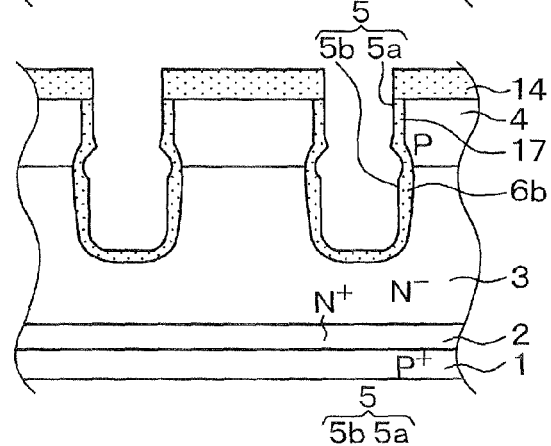

Next, as shown in FIG. 8B, isotropic etching of the second trench 5b is performed by using the insulation layer 17 as an etching mask to increase the depth of the second trench 5b in such a manner that the distance between the opposing points on the side wall of the second trench 5b becomes greater than the distance between the opposing points on the side wall of the first trench 5a. Thus, the trench 5 can be shaped like a vase.

Then, as shown in FIG. 8B, the second gate insulation layer 6b for the gate insulation layer 6 is formed on the wall surface of the second trench 5b by a thermal oxidation process. In the process shown in FIG. 8B, the second gate insulation layer 6b is also formed on the insulation layer 17 on the side wall of the first trench 5a and joined to the insulation layer 17 so that the thickness of the insulation layer 17 can be increased. For example, the second gate insulation layer 6b can be formed by a wet thermal oxidation process at a temperature of 1150° C. for a predetermined time. Alternatively, the second gate insulation layer 6b can be formed by a dry thermal oxidation process.

Figure 8C:
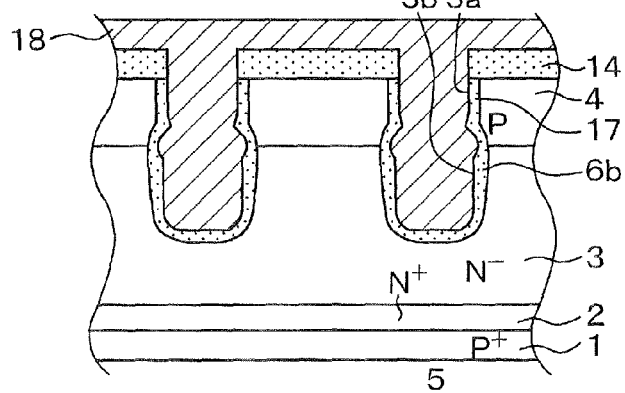
Figure 8D:
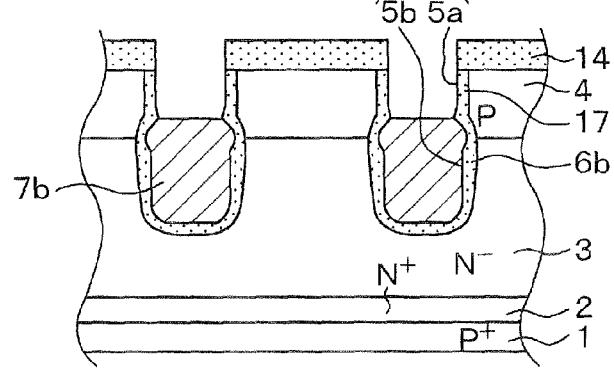

Next, as shown in FIG. 8C, the trench 5 is filled with a first conductive material 18 such as doped polysilicon. Then, as shown in FIG. 8D, the first conductive material 18 on the etching mask 14 is removed by an etching process or the like. Further, the first conductive material 18 in the first trench 5a of the trench 5 is removed by an etching process or the like, so that the insulation layer 17 on the side wall of the first trench 5a can be exposed. Thus, the second portion 7b of the gate electrode 7 is formed in the second trench 5b.

Figure 9A:
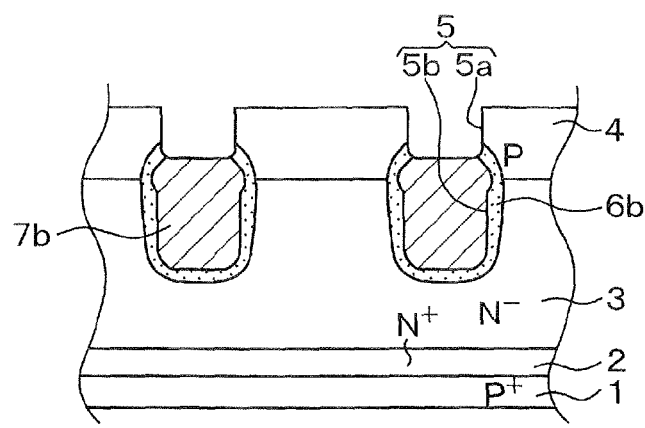
FIGS. 9A-9D are diagrams illustrating processes following the processes of FIGS. 8A-8D.

Then, as shown in FIG. 9A, the etching mask 14 and the insulation layer 17 on the side wall of the first trench 5a are removed, for example, by a cleaning process using hydrofluoric acid.

Figure 9B:
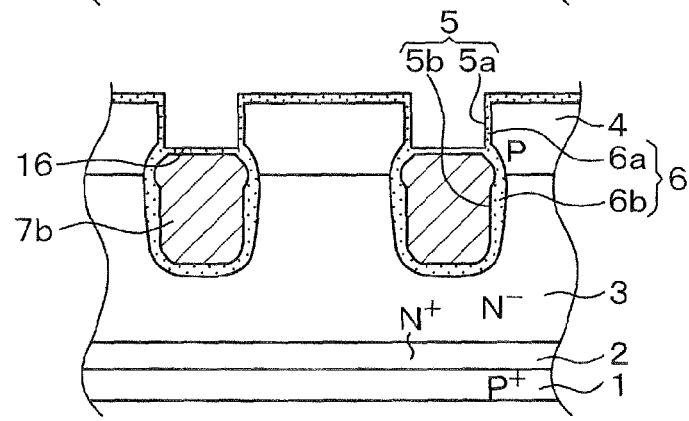

Next, as shown in FIG. 9B, the first gate insulation layer 6a for the gate insulation layer 6 is formed on the side wall of the first trench 5a, and the insulation layer 16 is formed on the second portion 7b. The first gate insulation layer 6a and the insulation layer 16 can be formed at the same time, for example, by a CVD method. In this case, a deposition time or the like is adjusted so that the first gate insulation layer 6a can be thinner than the second gate insulation layer 6b.

Figure 9C:
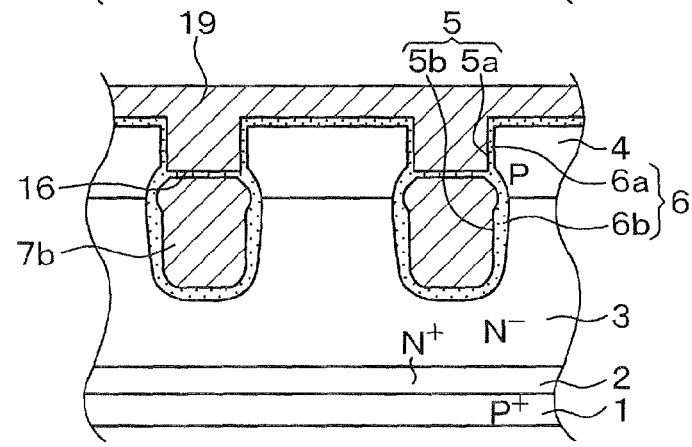
Figure 9D:
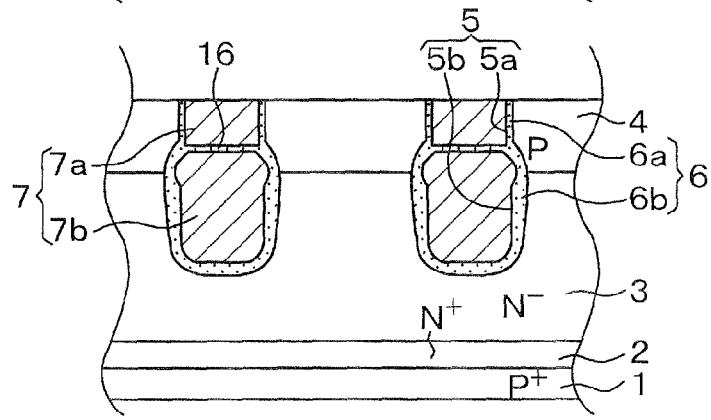

Then, as shown in FIG. 9C, the first trench 5a is filled with a second conductive material 19 such as doped polysilicon. Then, as shown in FIG. 9D, the second conductive material 19 and the first gate insulation layer 6a on the P-type base layer 4 are removed by an etching process or the like. Thus, the first portion 7a of the gate electrode 7 is formed in the first trench 5a and separated from the second portion 7b by the insulation layer 16. That is, the gate electrode 7 is divided into the first portion 7a and the second portion 7b.

Then, conventional manufacturing processes are performed, for example, to form the $N^+$-type emitter layer 9, the $P^+$-type contact layer 10, the interlayer dielectric layer 11, the emitter electrode 12, and the collector electrode 13. In this way, the semiconductor device shown in FIG. 6 is manufactured.

According to the above-described manufacturing method, the first distance L1 between the bottom portions of adjacent trench gate structures 8 becomes less than the second distance L2 between the opening portions of adjacent trench gate structures 8, and the thickness of the gate insulation layer 6 on the side wall of the second trench 5b becomes greater than the thickness of the gate insulation layer 6 on the side wall of the first trench 5a. Therefore, although the gate electrode 7 is divided, the same advantages as the first embodiment can be obtained.

Third Embodiment

Figure 10:
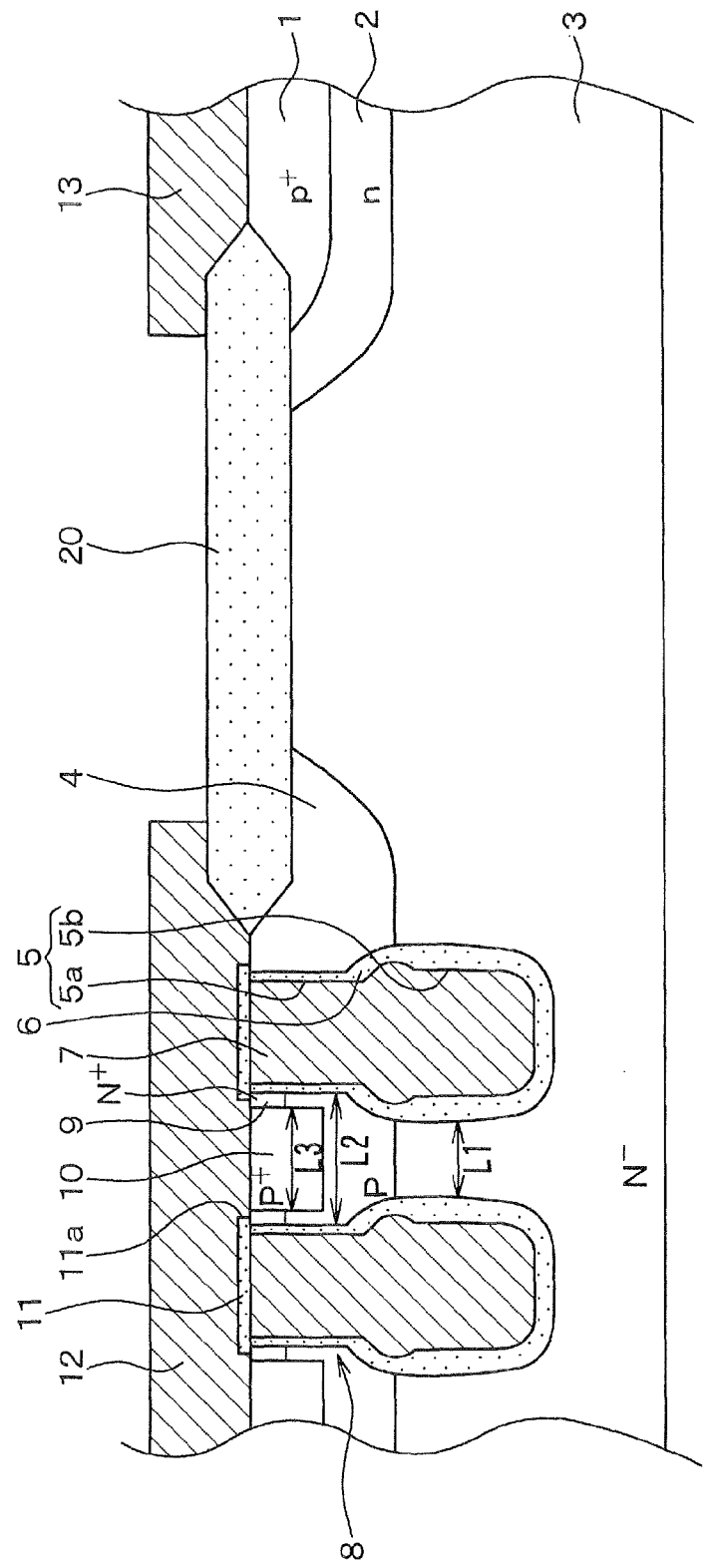
FIG. 10 is a diagram illustrating a cross-sectional view of a semiconductor device according to a third embodiment of the present invention.

A semiconductor device according to a third embodiment of the present invention is described below with reference to FIG. 10. FIG. 10 is a diagram illustrating a cross-sectional view of the semiconductor device. A difference of the third embodiment from the preceding embodiments is as follows.

In the preceding embodiments, the $P^+$-type collector layer 1 is located on the $N^-$-type drift layer 3 to cause a current to flow in the thickness direction of the $N^-$-type drift layer 3. That is, the semiconductor device according to the preceding embodiments is configured as a vertical semiconductor device.

In contrast, in the third embodiment, the $P^+$-type collector layer 1 is located in a surface portion of a front side of the drift layer 3 to cause a current to flow in the planar direction of the $N^-$-type drift layer 3. That is, the semiconductor device according to the third embodiment is configured as a lateral semiconductor device.

Specifically, as shown in FIG. 10, in the semiconductor device according to the third embodiment, the $N^+$-type buffer layer 2 is formed in the surface portion of the $N^-$-type drift layer 3 and separated from the $N^+$-type emitter layer 9. The $P^+$-type collector layer 1 is formed in a surface portion of the $N^-$-type drift layer 3. A local oxidation of silicon (LOCOS) layer 20 is formed on the surface of the $N^-$-type drift layer 3 between the trench gate structure 8 and the $P^+$-type collector layer 1.

For example, the semiconductor device shown in FIG. 10 can be manufactured as follows. Firstly, a semiconductor substrate as the $N^-$-type drift layer 3 is prepared. Then, the P-type base layer 4 is formed on the front side of the semiconductor substrate. Then, the processes shown in FIGS. 2A-2D, and 3A-3D are performed. Then, impurities are implanted into the front side of the semiconductor substrate by an ion implantation process. Then, an annealing process is performed so that the $N^+$-type buffer layer 2 and the $P^+$-type collector layer 1 can be formed.

(Modifications)

The above embodiments can be modified in various ways, for example, as follows.

In the embodiments, the N-type is defined as a first conductivity-type, and the P-type is defined as a second conductivity-type. Alternatively, the conductivity-type can be reversed.

In the embodiments, the trench 5 has a vase shape. The shape of the trench 5 is not limited to a vase shape. For example, the distance between the opposing points on the side wall of the second trench 5b can be equal to or less than the distance between the opposing points on the side wall of the first trench 5a. Even in such a case, the reduction in ON-voltage and the improvement in load short-circuit capability can be achieved by adjusting the second gate insulation layer 6b on the wall surface (side wall) of the second trench 5b in such a manner that the second gate insulation layer 6b on the wall surface (side wall) of the second trench 5b can be thicker than the first gate insulation layer 6a on the wall surface (side wall) of the first trench 5a. When the distance between the opposing points on the side wall of the second trench 5b is made equal to or less than the distance between the opposing points on the side wall of the first trench 5a in the first and third embodiments, there is no need to perform an isotropic etching process shown in FIG. 3B.

In the first embodiment, the $N^+$-type emitter layer 9 and the $P^+$-type contact layer 10 are formed after the process shown in FIG. 3D. Alternatively, the substrate prepared in the process shown in FIG. 2A can include the $N^+$-type emitter layer 9 and the $P^+$-type contact layer 10. However, it is preferable that the $N^+$-type emitter layer 9 and the $P^+$-type contact layer 10 be formed after the process shown in FIG. 3D, because the second gate insulation layer 6b is formed in the second trench 5b in the process shown in FIG. 3C. In such an approach, unnecessary diffusion of impurities can be reduced.

In the embodiments, the semiconductor device has the $P^+$-type contact layer 10. Alternatively, the semiconductor device can have no $P^+$-type contact layer 10. The depth of the $P^+$-type contact layer 10 can be less than the depth of the $N^+$-type emitter layer 9. The width of the $P^+$-type contact layer 10 can be less than the distance between the bottom portions of adjacent trench gate structures 8. Even in such a structure, the semiconductor device can have a low ON-voltage and an improved load short-circuit capability.

In the embodiments, the depth of the $P^+$-type contact layer 10 is made greater than the depth of the $N^+$-type emitter layer 9 by setting the acceleration voltage for ion implantation of the $P^+$-type contact layer 10 greater than the acceleration voltage for ion implantation of the $N^+$-type emitter layer 9. Alternatively, the depth of the $P^+$-type contact layer 10 can be made greater than the depth of the $N^+$-type emitter layer 9 at a relatively low acceleration voltage by forming a small trench at a position, where the $P^+$-type contact layer 10 is to be formed, before performing ion implantation of the $P^+$-type contact layer 10.

In the first and second embodiments, the substrate prepared in the process shown in FIG. 2A includes the $P^+$-type collector layer 1. Alternatively, the $P^+$-type collector layer 1 can be formed as follows. Firstly, a semiconductor substrate as the $1N^-$-type drift layer is prepared, and then the P-type base layer 4 is formed on a front side of the semiconductor substrate. Then, in the first embodiment, after the processes shown in FIGS. 2A-2D and 3A-3D are finished, impurities are ion-implanted into a back side of the semiconductor substrate. Then, the semiconductor substrate is annealed so that the $P^+$-type collector layer 1 can be formed. On the other hand, in the second embodiment, after the processes shown in FIGS. 7A-7D, 8A-8D, and 9A-9D are finished, impurities are ion-implanted into a back side of the semiconductor substrate. Then, the semiconductor substrate is annealed so that the $P^+$-type collector layer 1 can be formed. In such cases, in the first and second embodiments, the semiconductor substrate can be polished and thinned before the $P^+$-type collector layer 1 is formed.

In the third embodiment, the semiconductor substrate as the N⁻-type drift layer 3 is prepared. Alternatively, the N⁻-type drift layer 3 can be a semiconductor layer of a silicon-on-insulator (SOI) substrate including a supporting substrate, a buried insulation layer on the supporting substrate, and the semiconductor substrate on the buried insulation layer.

Such changes and modifications are to be understood as being within the scope of the present invention as defined by the appended claims.

What is claimed is:

1. A semiconductor device comprising:
   a first conductivity-type drift layer;
   a second conductivity-type base layer on a front side of the drift layer;
   a plurality of trench gate structures, each trench gate structure including a trench reaching the drift layer by penetrating the base layer, a gate insulation layer on a wall surface of the trench, and a gate electrode on the gate insulation layer, the trench gate structure having a length direction parallel to a planar direction of the drift layer, a width direction parallel to the planar direction of the drift layer and perpendicular to the length direction, and a depth direction perpendicular to the planar direction of the drift layer;
   a first conductivity-type emitter layer located in a surface portion of the base layer and located adjacent to the trench gate structure;
   a second conductivity-type collector layer located across the drift layer from the emitter layer, and
   a second conductivity-type contact layer located in the surface portion of the base layer and located between adjacent trench gate structures across the emitter layer, wherein
   the trench gate structure has a bottom portion and an opening portion, the bottom portion defining a bottom of the trench gate structure, the opening portion located on an opposite side of the trench gate structure from the bottom portion in the depth direction,
   the bottom portion of the trench gate structure is located in the drift layer and expands in the width direction so that a distance between the bottom portions of adjacent trench gate structures is less than a distance between the opening portions of adjacent trench gate structures in the width direction,
   a thickness of the gate insulation layer on the wall surface of the trench of the bottom portion is greater than a thickness of the gate insulation layer on the wall surface of the trench of the opening portion,
   the contact layer is located facing the drift layer between the bottom portions of adjacent trench gate structures,
   a depth of the contact layer is greater than a depth of the emitter layer from a surface of the base layer in the depth direction, and
   a width of the contact layer is greater than the distance between the bottom portions of adjacent trench gate structures in the width direction.

2. The semiconductor device according to claim 1, wherein the thickness of the gate insulation layer on a side wall of the trench of the bottom portion is greater than the thickness of the gate insulation layer on a side wall of the trench of the opening portion.

3. The semiconductor device according to claim 1, wherein the trench includes a first trench and a second trench, the first trench is located in the base layer, the second trench communicates with the first trench and reaches the drift layer, a distance between opposing points on a side wall of the second trench is greater than a distance between opposing points on a side wall of the first trench in the width direction, the thickness of the gate insulation layer on the wall surface of the second trench is greater than the thickness of the gate insulation layer on the wall surface of the first trench, and the bottom portion of the trench gate structure includes the second trench, the gate insulation layer on the wall surface of the second trench, and the gate electrode on the gate insulation layer on the wall surface of the second trench.

4. The semiconductor device according to claim 1, wherein the collector layer is located on a back side of the drift layer.

5. The semiconductor device according to claim 1, wherein the collector layer is located in a surface portion of the front side of the drift layer.

6. A method of manufacturing a semiconductor device, the method comprising:
   preparing a substrate including a second conductivity-type second collector layer, a first conductivity-type drift layer on the collector layer, and a second conductivity-type base layer on the drift layer;
   forming a plurality of first trenches in the base layer by an anisotropic etching process, each first trench having a length in a first direction;
   forming a first gate insulation layer in each first trench;
   forming an oxygen impermeable protection layer on the first gate insulation layer in each first trench;
   forming a plurality of second trenches communicating with the plurality of first trenches by removing the protection layer on a bottom of each first trench by an anisotropic etching process in such a manner that each second trench has a bottom in the drift layer and that each second trench expands in a second direction parallel to a planar direction of the substrate, the second direction being perpendicular to the first direction;
   forming a second gate insulation layer thicker than the first gate insulation layer in each second trench by a thermal oxidation process;
   removing the protection layer on an inner side wall of each first trench;
   forming a gate electrode on the first gate insulation layer and the second gate insulation layer;
   forming a first conductivity-type emitter layer in a surface portion of the base layer between adjacent first trenches in such a manner that the emitter layer is located adjacent to each first trench; and
   forming a second conductivity-type contact layer in the surface portion of the base layer between adjacent first trenches across the emitter layer, wherein
   the contact layer is located facing the drift layer between adjacent second trenches in a third direction perpendicular to the planar direction of the substrate,
   a depth of the contact layer is greater than a depth of the emitter layer from a surface of the base layer in the third direction, and
   a width of the contact layer is greater than a distance between adjacent second trenches in the second direction.

7. The method according to claim 6, wherein the forming of the plurality of second trenches includes performing an isotropic etching process to expand each second trench in the second direction in such a manner that a width of each second trench is greater than a width of each first trench in the second direction.

8. A method of manufacturing a semiconductor device, the method comprising:
- preparing a substrate including a second conductivity-type second collector layer, a first conductivity-type drift layer on the collector layer, and a second conductivity-type base layer on the drift layer;
- forming a plurality of first trenches in the base layer by an anisotropic etching process, each first trench having a length in a first direction;
- forming a first insulation layer in each first trench;
- forming a plurality of second trenches communicating with the plurality of first trenches by removing the first insulation layer on a bottom of each first trench by an anisotropic etching process in such a manner that each second trench has a bottom in the drift layer and that each second trench expands in a second direction parallel to a planar direction of the substrate, the second direction being perpendicular to the first direction;
- forming a second insulation layer in each second trench by a thermal oxidation process;
- filling each first trench and each second trench with a first conductive material to form a gate electrode on the first insulation layer and the second insulation layer;
- removing the first conductive material in each first trench;
- removing the first insulation layer on an inner side wall of each first trench;
- forming a third insulation layer on the inner side wall of each first trench and on the first conductive material in each second trench in such a manner that the third insulation layer is thinner than the second insulation layer;
- filling each first trench with a second conductive material to form the gate electrode;
- forming a first conductivity-type emitter layer in a surface portion of the base layer between adjacent first trenches in such a manner that the emitter layer is located adjacent to each first trench; and
- forming a second conductivity-type contact layer in the surface portion of the base layer between adjacent first trenches across the emitter layer, wherein
- the contact layer is located facing the drift layer between adjacent second trenches in a third direction perpendicular to the planar direction of the substrate,
- a depth of the contact layer is greater than a depth of the emitter layer from a surface of the base layer in the third direction, and
- a width of the contact layer is greater than a distance between adjacent second trenches in the second direction.

9. The method according to claim 8, wherein
the forming of the plurality of second trenches includes performing an isotropic etching process to expand each second trench in the second direction in such a manner that a width of each second trench is greater than a width of each first trench in the second direction.

10. A method of manufacturing a semiconductor device, the method comprising:
- preparing a substrate including a first conductivity-type drift layer and a second conductivity-type base layer on a front side of the drift layer;
- forming a plurality of first trenches in the base layer by an anisotropic etching process, each first trench having a length in a first direction;
- forming a first gate insulation layer in each first trench;
- forming an oxygen impermeable protection layer on the first gate insulation layer in each first trench;
- forming a plurality of second trenches communicating with the plurality of first trenches by removing the protection layer on a bottom of each first trench by an anisotropic etching process in such a manner that each second trench has a bottom in the drift layer and that each second trench expands in a second direction parallel to a planar direction of the substrate, the second direction being perpendicular to the first direction;
- forming a second gate insulation layer thicker than the first gate insulation layer in each second trench by a thermal oxidation process;
- forming a second conductivity-type collector layer by ion implantation of impurities into the substrate and by annealing the substrate;
- forming a first conductivity-type emitter layer in a surface portion of the base layer between adjacent first trenches in such a manner that the emitter layer is located adjacent to each first trench; and
- forming a second conductivity-type contact layer in the surface portion of the base layer between adjacent first trenches across the emitter layer, wherein
- the contact layer is located facing the drift layer between adjacent second trenches in a third direction perpendicular to the planar direction of the substrate,
- a depth of the contact layer is greater than a depth of the emitter layer from a surface of the base layer in the third direction, and
- a width of the contact layer is greater than a distance between adjacent second trenches in the second direction.

11. The method according to claim 10, wherein
the ion implantation is performed from a back side of the drift layer.

12. The method according to claim 10, wherein
the forming of the plurality of second trenches includes performing an isotropic etching process to expand each second trench in the second direction in such a manner that a width of each second trench is greater than a width of each first trench in the second direction.

13. A method of manufacturing a semiconductor device, the method comprising:
- preparing a substrate including a first conductivity-type drift layer and a second conductivity-type base layer on a front side of the drift layer;
- forming a plurality of first trenches in the base layer by an anisotropic etching process, each first trench having a length in a first direction;
- forming a first insulation layer in each first trench;
- forming a plurality of second trenches communicating with the plurality of first trenches by removing the first insulation layer on a bottom of each first trench by an anisotropic etching process in such a manner that each second trench has a bottom in the drift layer and that each second trench expands in a second direction parallel to a planar direction of the substrate, the second direction being perpendicular to the first direction;
- forming a second insulation layer in each second trench by a thermal oxidation process;
- filling each first trench and each second trench with a first conductive material to form a gate electrode on the first insulation layer and the second insulation layer;
- removing the first conductive material in each first trench;
- removing the first insulation layer on an inner side wall of each first trench;
- forming a third insulation layer on the inner side wall of each first trench and on the first conductive material in each second trench in such a manner that the third insulation layer is thinner than the second insulation layer filling each first trench with a second conductive material to form the gate electrode;

forming a second conductivity-type collector layer by ion implantation of impurities into the substrate and by annealing the substrate;

forming a first conductivity-type emitter layer in a surface portion of the base layer between adjacent first trenches in such a manner that the emitter layer is located adjacent to each first trench; and forming a second conductivity-type contact layer in the surface portion of the base layer between adjacent first trenches across the emitter layer, wherein the contact layer is located facing the drift layer between adjacent second trenches in a third direction perpendicular to the planar direction of the substrate, a depth of the contact layer is greater than a depth of the emitter layer from a surface of the base layer in the third direction, and a width of the contact layer is greater than a distance between adjacent second trenches in the second direction.

14. The method according to claim 13, wherein
the ion implantation is performed from a back side of the drift layer.

15. The method according to claim 13, wherein
the forming of the plurality of second trenches includes performing an isotropic etching process to expand each second trench in the second direction in such a manner that a width of each second trench is greater than a width of each first trench in the second direction.

* * * * *